(12) United States Patent
Chiang et al.

(10) Patent No.: US 10,890,382 B2
(45) Date of Patent: Jan. 12, 2021

(54) HEAT DISSIPATION DEVICE

(71) Applicant: ASIA VITAL COMPONENTS CO., LTD., New Taipei (TW)

(72) Inventors: Kuei-Feng Chiang, New Taipei (TW); Chih-Yeh Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 15/792,993

(22) Filed: Oct. 25, 2017

(65) Prior Publication Data

US 2018/0372418 A1    Dec. 27, 2018

Related U.S. Application Data

(63) Continuation-in-part of application No. 15/629,757, filed on Jun. 22, 2017, now abandoned.

(51) Int. Cl.
| | | |
|---|---|---|
| F28D 15/04 | (2006.01) | |
| F28F 21/08 | (2006.01) | |
| H05K 7/20 | (2006.01) | |
| H01L 23/427 | (2006.01) | |
| H01L 23/373 | (2006.01) | |

(52) U.S. Cl.
CPC .......... *F28D 15/046* (2013.01); *F28D 15/04* (2013.01); *F28F 21/086* (2013.01); *F28F 21/089* (2013.01); *H01L 23/3736* (2013.01); *H01L 23/427* (2013.01); *H05K 7/20336* (2013.01); *F28F 2245/02* (2013.01); *F28F 2245/04* (2013.01)

(58) Field of Classification Search
CPC ............... F28D 15/0233; H05K 7/20

USPC .................................................. 165/104.26
See application file for complete search history.

(56) References Cited

U.S. PATENT DOCUMENTS

| | | | | |
|---|---|---|---|---|
| 4,046,190 A | * | 9/1977 | Marcus ............... | F28D 15/0233 165/104.26 |
| 4,557,413 A | * | 12/1985 | Lewis .................... | B23K 20/00 228/183 |
| 2002/0189793 A1 | * | 12/2002 | Noda .................. | F28D 15/0233 165/104.26 |
| 2003/0159806 A1 | * | 8/2003 | Sehmbey ............ | F28D 15/0233 165/104.26 |
| 2014/0237822 A1 | * | 8/2014 | Yang ................... | F28D 15/0266 29/890.03 |
| 2015/0013943 A1 | * | 1/2015 | Inagaki ................. | F28D 15/046 165/104.26 |

* cited by examiner

*Primary Examiner* — Leonard R Leo
(74) *Attorney, Agent, or Firm* — Thomas J. Nikolai; DeWitt LLP (57) ABSTRACT

A heat dissipation device includes two titanium metal sheets, which are subjected to a heat treatment before undergoing mechanical processing, plastic working and surface modification. With these arrangements, the titanium metal sheets can be freely plastically deformed and possess a capillary force, and can therefore be used in place of the conventional copper material to serve as a material for making heat dissipation devices, and the heat dissipation devices so produced can have largely reduced weight and largely improved heat dissipation performance.

5 Claims, 9 Drawing Sheets

S1 — Prepare a first titanium metal sheet and a second titanium metal sheet, and carry out a pre-cleaning operation for the first and second titanium metal sheets S2 — Perform a heat treatment on the cleaned first and second titanium metal sheets S3 — Stamp the first titanium metal sheet to form a plurality of raised sections thereon S4 — Bond a metal mesh to one surface of the second titanium metal sheet S5 — Close a surface of the first titanium metal sheet having the raised sections onto the surface of the second titanium metal sheet having the metal mesh bonded thereto, and carry out subsequent operations, including seam welding, working fluid filling, vacuumizing and sealing

Fig. 10

```
┌─────────────────────────────────────────────────────────────┐
│ Prepare a first titanium metal sheet and a second titanium  │
│ metal sheet, and carry out a pre-cleaning operation for the │──── S1
│ first and second titanium metal sheets                      │
└─────────────────────────────────────────────────────────────┘
                              ↓
┌─────────────────────────────────────────────────────────────┐
│ Perform a heat treatment on the cleaned first and second    │──── S2
│ titanium metal sheets                                       │
└─────────────────────────────────────────────────────────────┘
                              ↓
┌─────────────────────────────────────────────────────────────┐
│ Stamp the first titanium metal sheet to form a plurality of │──── S3
│ raised sections thereon                                     │
└─────────────────────────────────────────────────────────────┘
                              ↓
┌─────────────────────────────────────────────────────────────┐
│ Bond a metal mesh to one surface of the second titanium     │──── S4
│ metal sheet                                                 │
└─────────────────────────────────────────────────────────────┘
                              ↓
┌─────────────────────────────────────────────────────────────┐
│ Perform a surface modification treatment on the first and   │
│ the second titanium metal sheet, so that at least one       │
│ coating is formed on a surface of each of the first         │──── S6
│ titanium metal sheet, the second titanium metal sheet and   │
│ the metal mesh                                              │
└─────────────────────────────────────────────────────────────┘
                              ↓
┌─────────────────────────────────────────────────────────────┐
│ Close a surface of the first titanium metal sheet having    │
│ the raised sections onto the surface of the second titanium │
│ metal sheet having the metal mesh bonded thereto, and carry │──── S5
│ out subsequent operations, including seam welding, working  │
│ fluid filling, vacuumizing and sealing                      │
└─────────────────────────────────────────────────────────────┘
```

Fig. 11

HEAT DISSIPATION DEVICE

This application is a continuation-in-part of U.S. patent application Ser. No. 15/629,757 filed on Jun. 22, 2017.

FIELD OF THE INVENTION

The present invention relates to a heat dissipation device, and more particularly to a heat dissipation device manufactured with pure titanium metal.

BACKGROUND OF THE INVENTION

The currently available electronic devices all have a largely increased computing speed, and as a result, the electronic elements in the electronic devices tend to produce a high amount of heat while operating. At least one heat dissipation unit, such as a heat pipe, a heat spreader, a vapor chamber or a radiator, is usually adopted by electronic device manufacturers to solve the problem of heat produced by the internal electronic elements. The heat dissipation unit can be directly in contact with or be associated with a heat-producing electronic element to carry the produced heat away from the electronic element. Or, a cooling fan can be further provided and connected to the heat dissipation unit to achieve forced heat dissipation.

Generally, heat dissipation units are made of aluminum, copper or stainless steel because these materials are characterized by high thermal conductivity to enable faster heat dissipation. Among others, copper is the most frequently adopted material for making heat transfer and dissipation devices. While copper has the advantage of high heat transfer speed, it has some disadvantages. For example, copper crystalline grains tend to grow and become coarse when the copper (Cu) material is subjected to a high-temperature reduction process, which would cause largely lowered yield strength of the copper material. In addition, copper has a relatively lower hardness and is easily deformed and could not automatically return to it original shape after the deformation.

In addition, the currently very popular smart handheld devices, such as cell phones, tablet computers and notebook computers, as well as the smart wearing devices and the slim-type electronic devices all require a thinner passive heat dissipation device for heat dissipation. For this purpose, copper foil has been used in place of copper sheet to meet the demands for thinner handheld and wearing electronic devices. However, copper foil is even softer and lacks sufficient structural supporting strength, which renders it not suitable for many specific applications. Further, due to its softness and insufficient supporting strength, copper foil is easily deformed by an external force applied thereto to damage its internal heat transfer structure.

Moreover, heat dissipation units made of aluminum, copper or stainless steel could not be used in some special environments or severe climate conditions, such as a corrosive, highly humid, highly salty, severely cold, high-temperature or vacuum environment or the outer space. Therefore, there are electronic device manufacturers who try to use titanium alloys in place of copper in making heat dissipation units. While titanium alloys have the advantages of high hardness, light weight, and good corrosion, high-temperature and severe cold resistance, they are not easily processed. In other words, while titanium alloys can usually be processed by cutting or some non-conventional machining, they are hardly plastically deformable. That is why titanium alloys still could not be used in place of copper materials at the present time.

SUMMARY OF THE INVENTION

To overcome the disadvantages of the prior art heat dissipation units, a primary object of the present invention is to provide a heat dissipation device that uses commercially pure titanium in place of copper to achieve improved heat dissipation performance.

To achieve the above and other objects, the heat dissipation device provided according to the present invention includes a first titanium metal sheet and a second titanium metal sheet.

The first titanium metal sheet has a first surface and an opposite second surface, and the first surface has a plurality of raised sections formed thereon. And, a first coating is formed on surfaces of the raised sections.

The second titanium metal sheet has a third surface and an opposite fourth surface, and the third surface has a metal mesh bonded thereto. A second coating is formed on the third surface of the second titanium metal sheet and located between the third surface and the metal mesh, and a third coating is formed on a surface of the metal mesh opposite to the second coating. The first titanium metal sheet and the second titanium metal sheet are correspondingly closed to each other to together define a seal chamber between them; and a working fluid is filled in the sealed chamber.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and by referring to the accompanying drawings. For the purpose of easy to understand, elements that are the same in the preferred embodiments are denoted by the same reference numerals.

Figure 1:
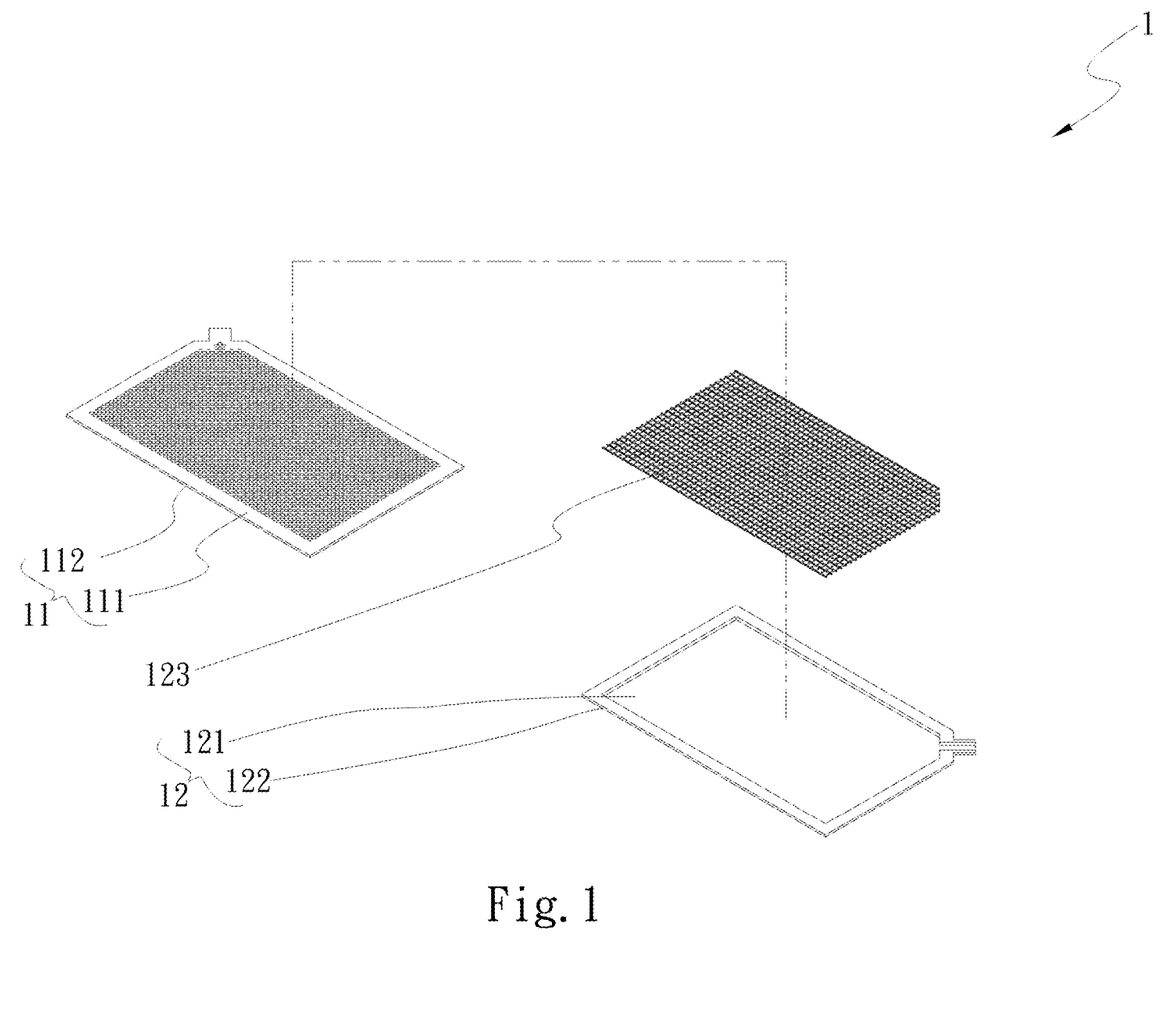
FIG. 1 is an exploded perspective view of a first embodiment of a heat dissipation device according to the present invention.
Figure 2:
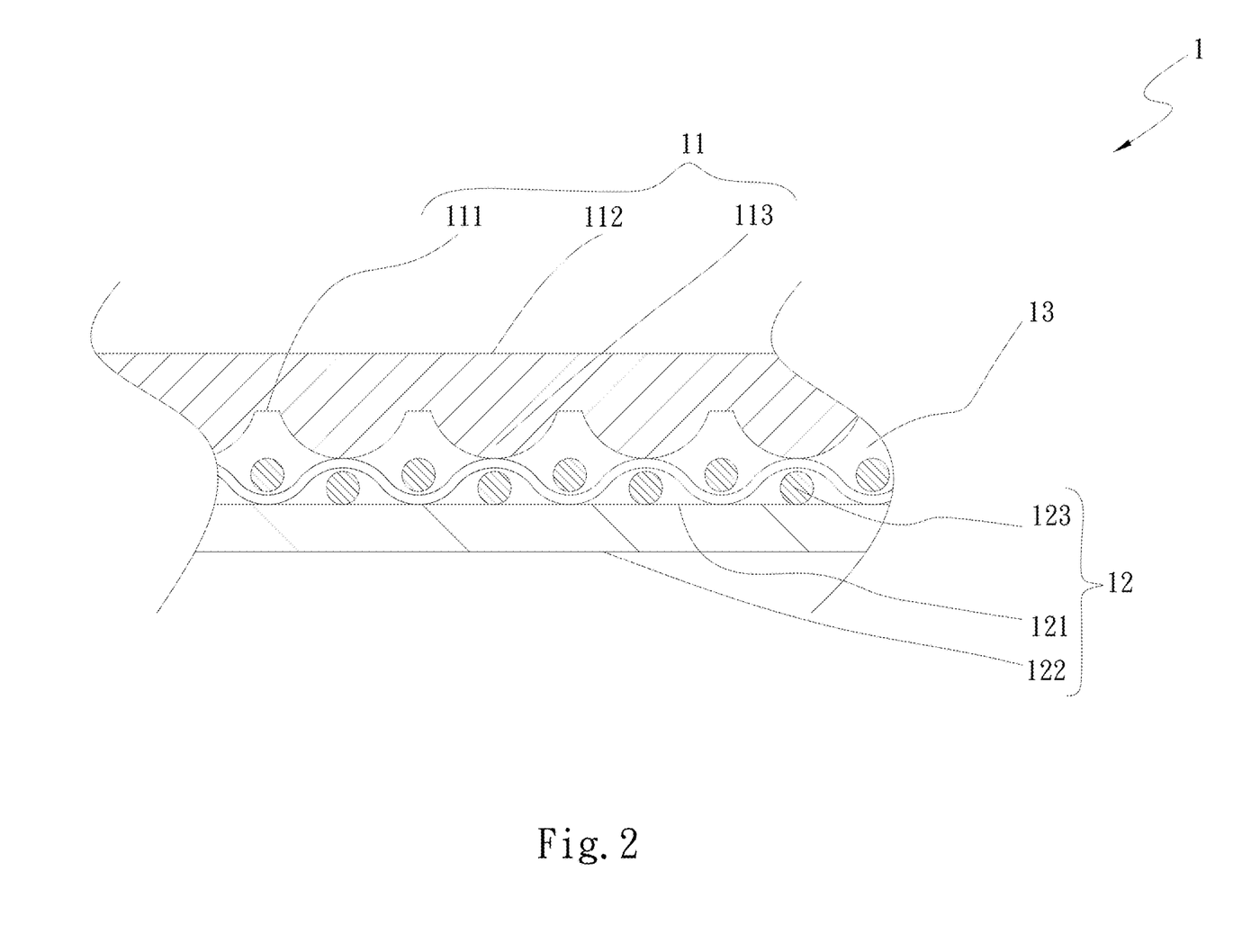
FIG. 2 is an assembled sectional view of the heat dissipation device of FIG. 1.

Please refer to FIGS. 1 and 2, which are exploded perspective and assembled sectional views, respectively, of a first embodiment of a heat dissipation device 1 according to the present invention. As shown, the illustrated first embodiment of the heat dissipation device 1 includes a first titanium metal sheet 11 and a second titanium metal sheet 12.

The first titanium metal sheet 11 has a first surface 111 and an opposite second surface 112. The first surface 111 has a plurality of raised sections 113 formed thereon by means of stamping. In the present invention, the second surface 112 serves as a condensing side of the heat dissipation device 1.

The second titanium metal sheet 12 has a third surface 121 and an opposite fourth surface 122. As can be seen in FIG. 2, a metal mesh 123 is disposed on a top of the third surface 121. The first and the second titanium metal sheet 11, 12 are correspondingly closed to each other to together define a sealed chamber 13, in which a working fluid (not shown) is filled. In the present invention, the fourth surface 122 serves as a heat-absorbing side of the heat dissipation device 1.

Figure 3:
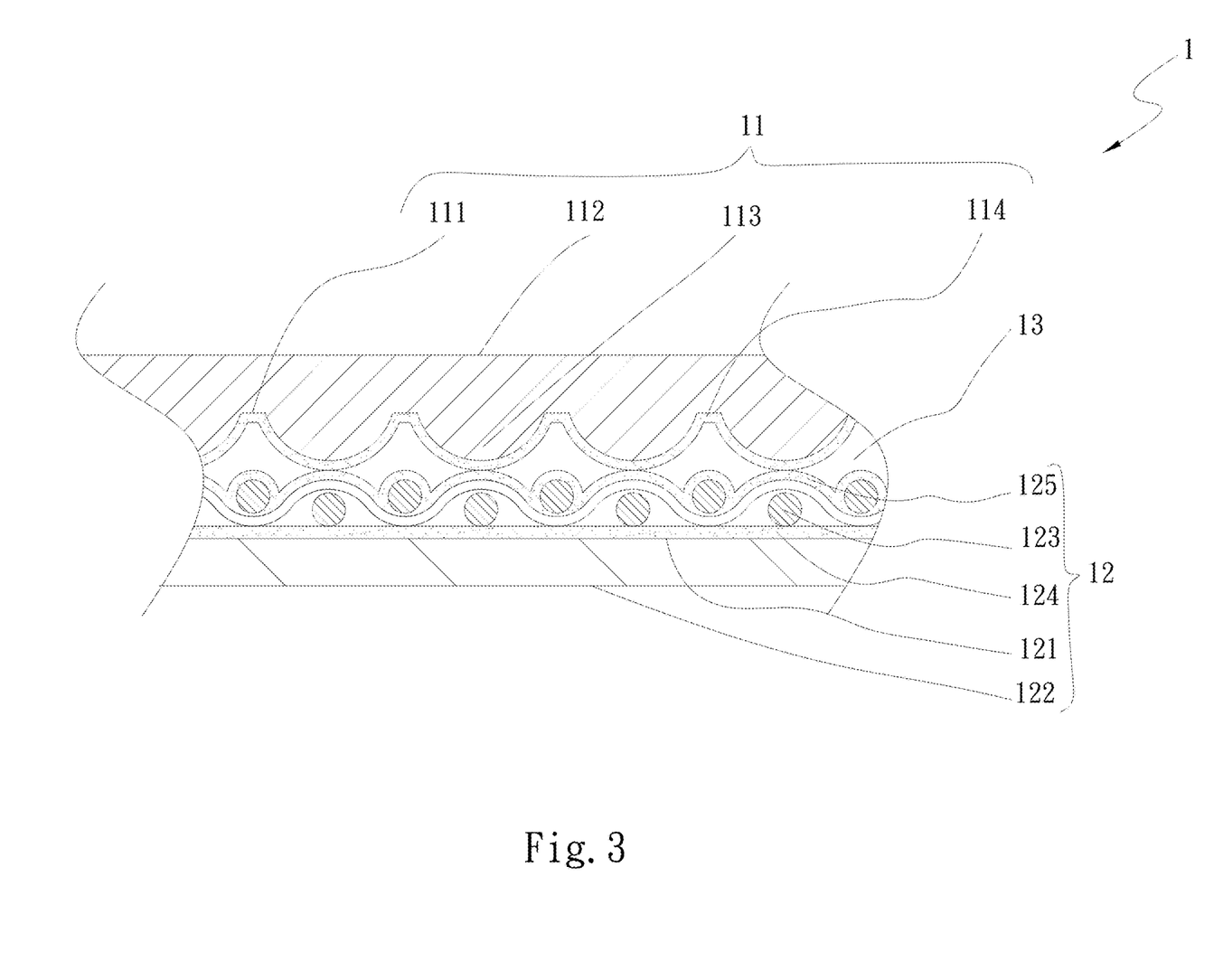
FIG. 3 is an assembled sectional view of a second embodiment of the heat dissipation device according to the present invention.
Figure 6:
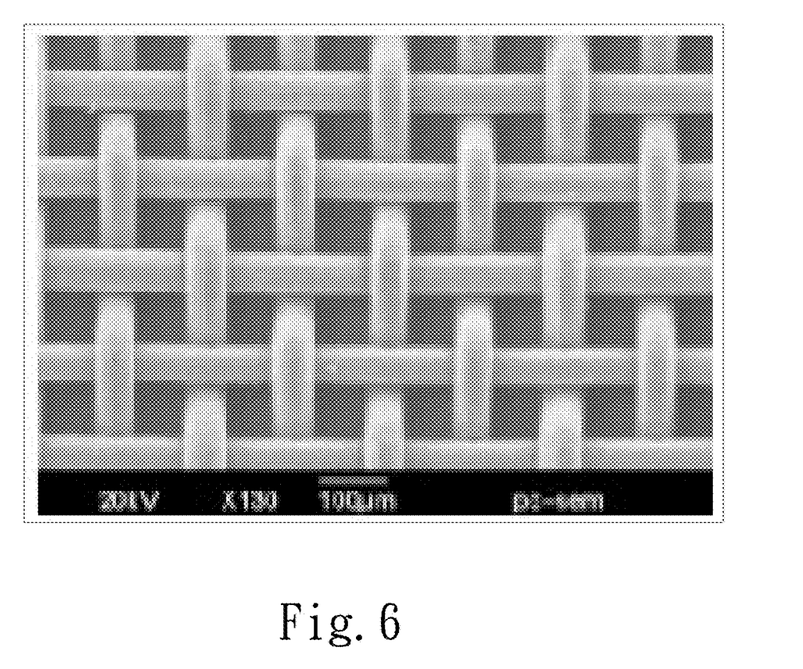
FIG. 6 is an electron microscopic image of a metal mesh adopted by the heat dissipation device of the present invention.
Figure 7:
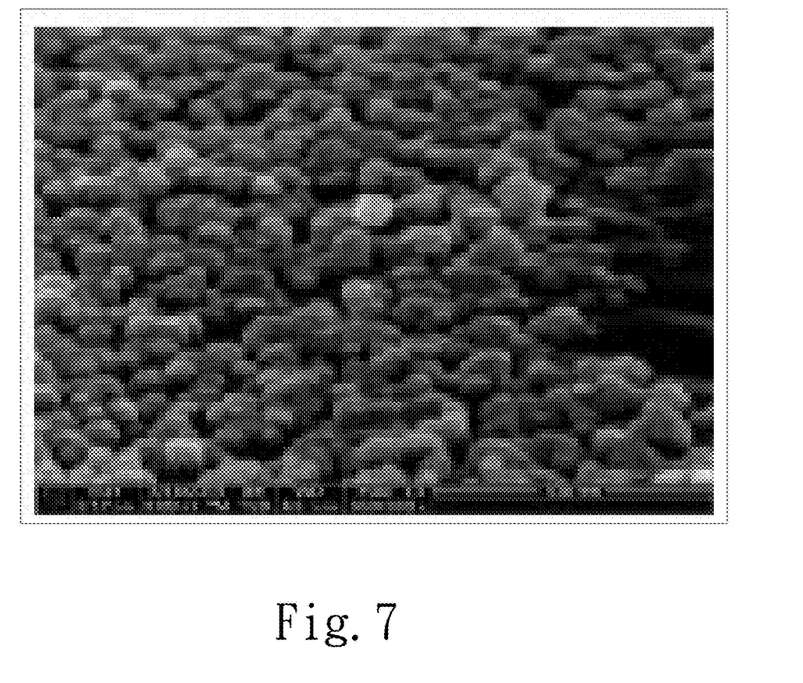
FIG. 7 is a first electron microscopic image of a first, a second and a third coating formed on the heat dissipation device of the present invention.
Figure 8:
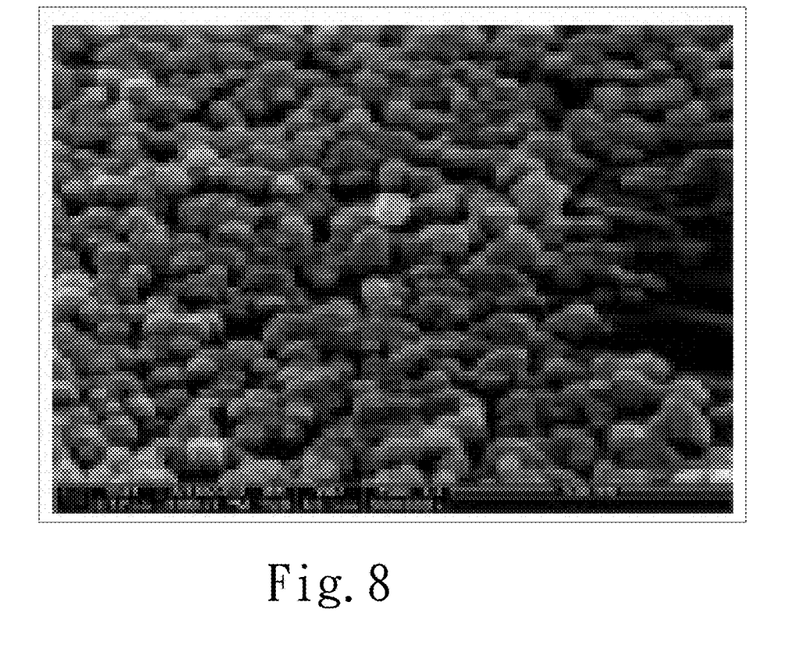
FIG. 8 is a second electron microscopic image of the first, the second and the third coating formed on the heat dissipation device of the present invention.
Figure 9:
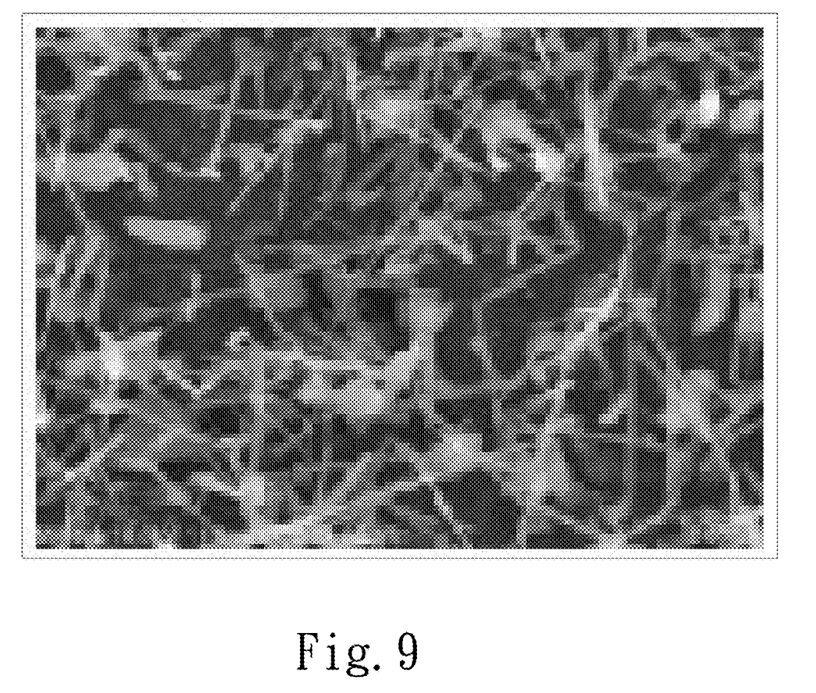
FIG. 9 is a third electron microscopic image of the first, the second and the third coating formed on the heat dissipation device of the present invention.

FIG. 3 is an assembled sectional view of a second embodiment of the heat dissipation device 1 according to the present invention. As shown, the second embodiment is different from the first embodiment in including a first coating 114 formed on surfaces of the raised sections 113, a second coating 124 formed on the third surface 121 and located between the metal mesh 123 and the third surface 121, and a third coating 125 formed on a surface of the metal mesh 123 opposite to the second coating 124. Since all other structural features of the second embodiment are similar to those of the first embodiment, they are not repeatedly described herein. The first, second and third coatings 114, 124, 125 can be respectively a hydrophilic coating or a hydrophobic coating. In the case of the hydrophilic coating, it can be a titanium dioxide ($TiO_2$) coating or a silicon dioxide ($SiO_2$) coating. FIG. 6 is an electron microscopic image of the metal mesh 123, and FIGS. 7, 8 and 9 are electro microscopic images of different types of the first, second and third coatings 114, 124, 125.

The selection of hydrophilic or hydrophobic first, second and third coatings 114, 124, 125 is determined mainly according to the position and the usage of the coatings. For instance, the first coating 114 on the first surface 111 can be a hydrophilic or a hydrophobic coating; the second coating 124 on the third surface 121 is preferably a hydrophilic coating for the purpose of providing an increased water-absorbing capacity and enabling an increased bonding strength between the third surface 121 and the metal mesh 123; and the third coating 125 on the metal mesh 123 is preferably a hydrophilic coating for the purpose of providing an increased water-bearing capacity and an enhanced back flowing of the working fluid.

The metal mesh 123 can be made of titanium, stainless steel, copper, aluminum or any other suitable metal material. In the illustrated second embodiment, the metal mesh 123 is made of titanium. However, it is understood the metal mesh 123 is not limited to a titanium mesh but can be otherwise a composite mesh formed by knitting a titanium material and a stainless steel material into a mesh.

The first and the second titanium metal sheet 11, 12 for use in the present invention are selected from commercially pure titanium materials, and are subjected to a pre-heat treatment before they can undergo a plastic working.

Figure 4:
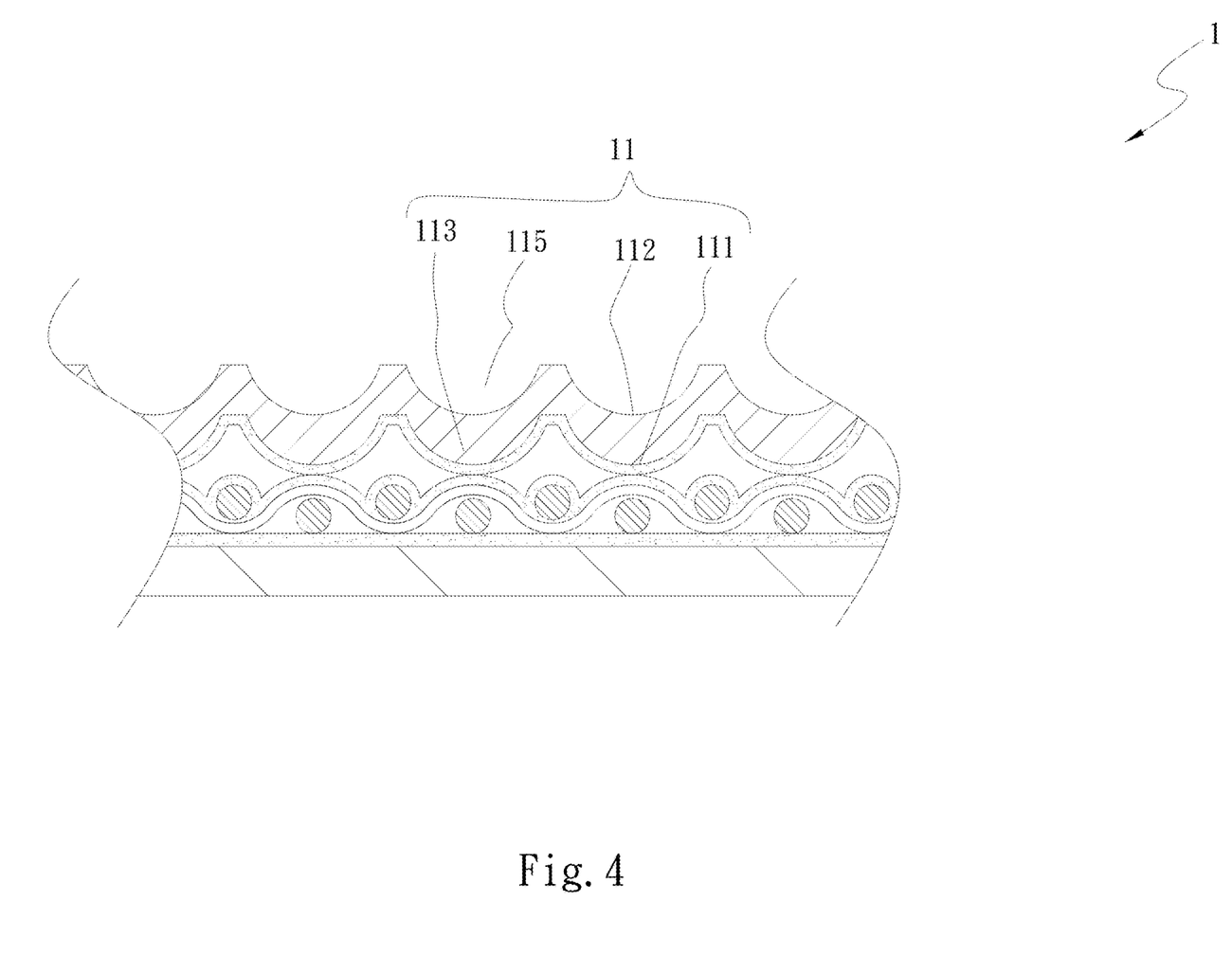
FIG. 4 is an assembled sectional view of a third embodiment of the heat dissipation device according to the present invention.

FIG. 4 is an assembled sectional view of a third embodiment of the heat dissipation device 1 according to the present invention. As shown, the third embodiment is different from the first embodiment in that the first titanium metal sheet 11 is provided on the second surface 112 with a plurality of sunken sections 115, which are located in one-to-one correspondence to the raised sections 113 formed on the first surface 111. The raised sections 113 and sunken sections 115 can be correspondingly formed on the first and second surfaces 111, 112, respectively, of the first titanium metal sheet 11 by means of embossing.

Figure 5:
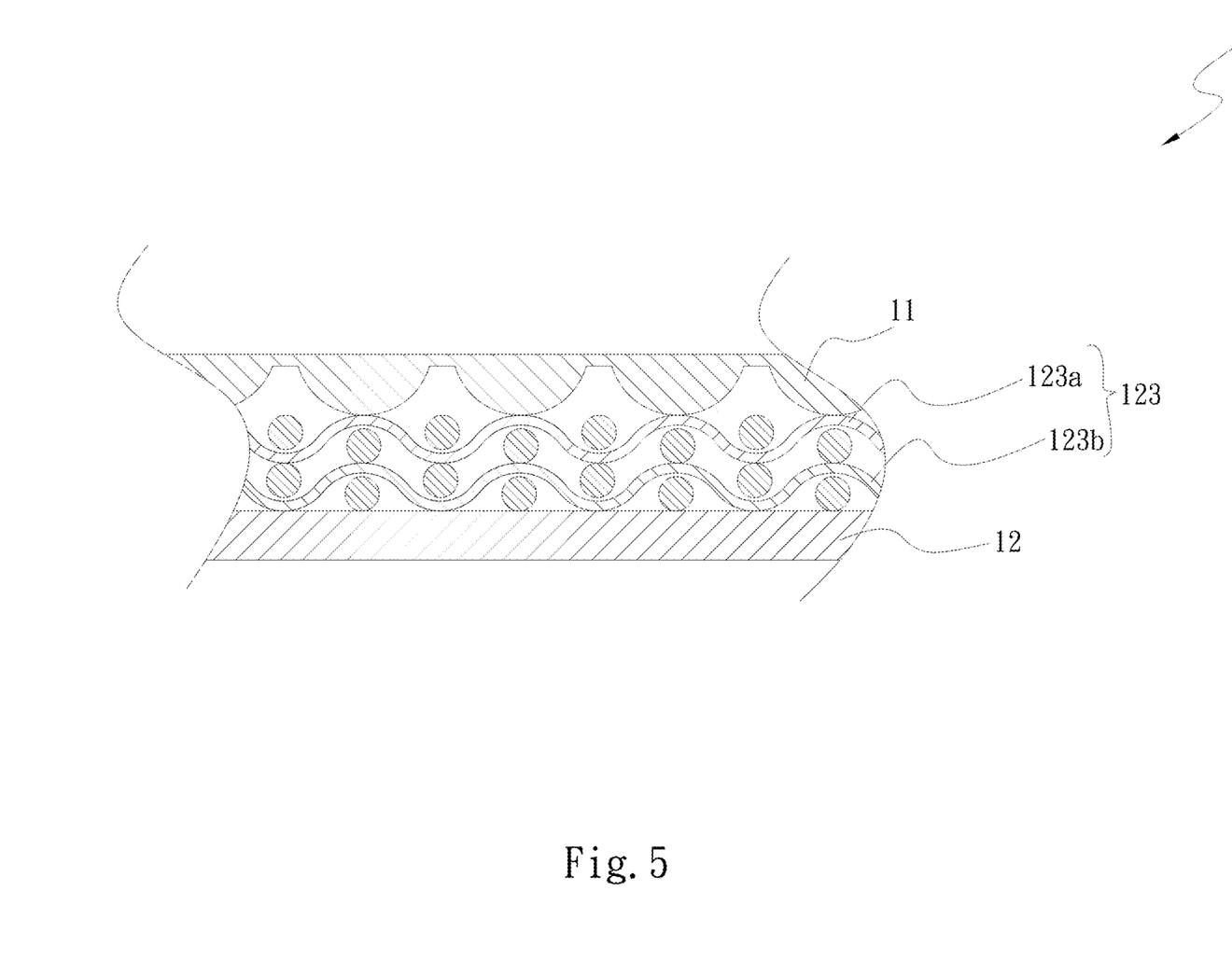
FIG. 5 is an assembled sectional view of a fourth embodiment of the heat dissipation device according to the present invention.

FIG. 5 is an assembled sectional view of a fourth embodiment of the heat dissipation device 1 according to the present invention. As shown, the fourth embodiment is different from the first embodiment in that the metal mesh 123 includes a first metal mesh 123a and a second metal mesh 123b. The first metal mesh 123a is made of titanium, and the second metal mesh 123b is made of stainless steel. The first metal mesh 123a and the second metal mesh 123b are superposed and connected to the first titanium metal sheet 11 and the second titanium metal sheet 12, respectively.

Figure 10:
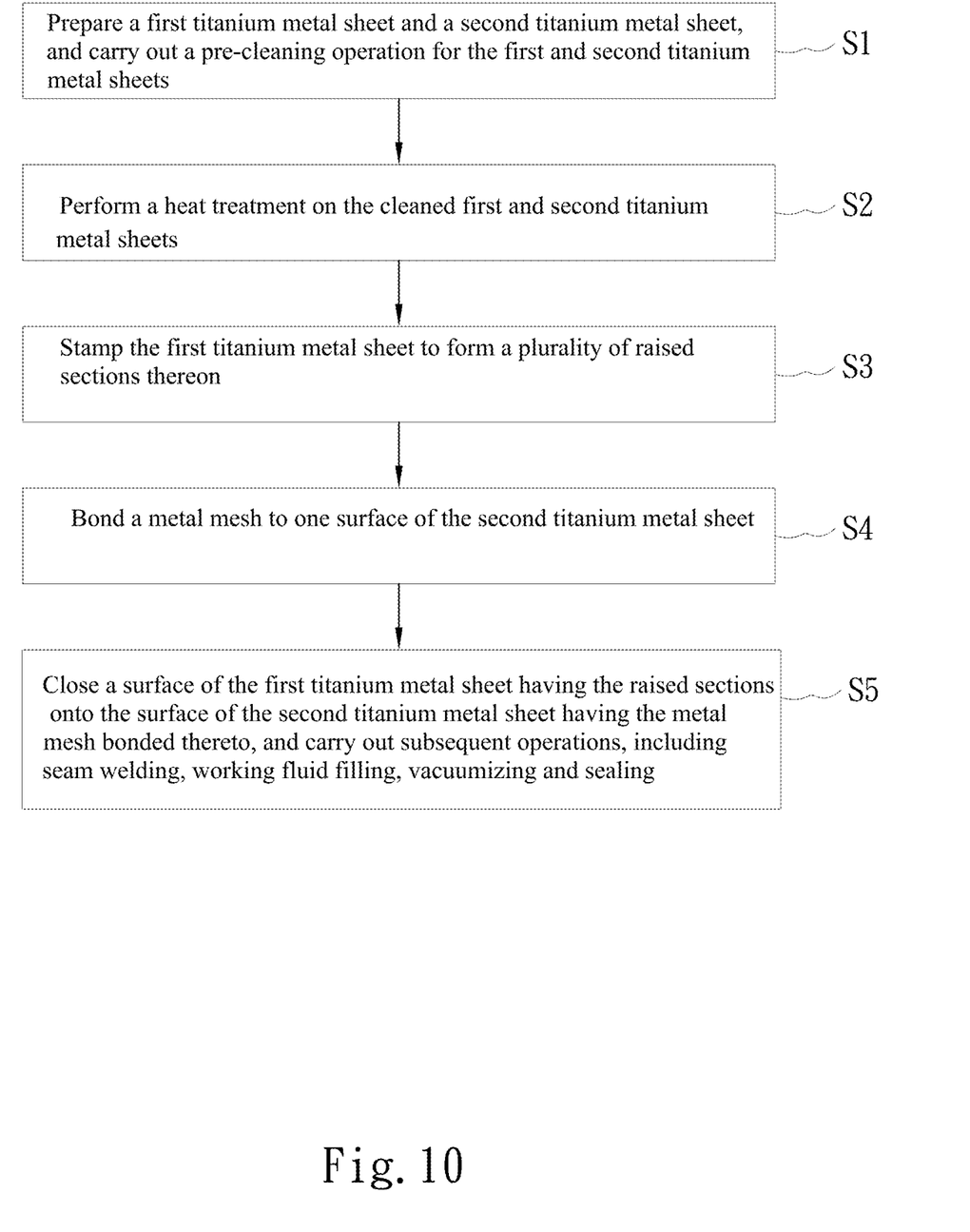
FIG. 10 is a flowchart showing the steps included in a first embodiment of a method of manufacturing the heat dissipation device of the present invention.

FIG. 10 is a flowchart showing the steps included in a first embodiment of a method of manufacturing the heat dissipation device of the present invention. Please refer to FIG. 10 along with FIGS. 1 through 9. As shown, according to the first embodiment thereof, the method of manufacturing the heat dissipation device of the present invention includes the following steps:

Step S1: Prepare a first titanium metal sheet and a second titanium metal sheet, and carry out a pre-cleaning operation for the first and second titanium metal sheets.

More specifically, a pre-cleaning operation is carried out for the first and the second titanium metal sheet 11, 12 to be further processed. In the pre-cleaning operation, the prepared first and second titanium metal sheets are wiped with acetone and then washed with de-ionized water in an ultrasonic cleaning machine. Finally, surfaces of the first and second titanium metal sheets 11, 12 are dried with nitrogen gas. The first and second titanium metal sheets 11, 12 are selected from commercially pure titanium material instead of general titanium alloys. The pure titanium material has the advantage of higher specific strength, i.e. higher tensile strength/density. Copper (Cu) has a density of 8.96 g/cm$^3$ and pure titanium (Ti) has a density of 4.54 g/cm$^3$, which is about one-half of the density of copper. Therefore, compared to copper of the same volume, pure titanium with higher specific strength has higher strength but lower weight.

A layer of oxidized film of $TiO_2$, $TiO_3$ or $TiO$ having a thickness of several hundreds of Å (1 Å=$10^{-10}$ meter), high stability and strong adhesion force will form on the surface of pure titanium at room temperature. The oxidized film formed on the surface of the pure titanium has the ability of self-repairing after a surface damage, which proves titanium is a metal showing a strong tendency of passivation. Therefore, titanium has a corrosion resistance much better than that of copper to facilitate the application of a vapor chamber in various environmental conditions. Titanium shows excellent corrosion resistance in humid environments, seawater, chlorine-containing solutions, hypochlorite, nitric acid, chromic acid and general oxidizing acidic environments.

Step S2: Perform a heat treatment on the cleaned first and second titanium metal sheets.

More specifically, the cleaned first and second titanium metal sheets 11, 12 are positioned in an atmosphere furnace (not shown) and argon gas is supplied into the atmosphere furnace. The atmosphere furnace is then heated to 400° C.~700° C. for 30~90 minutes. The main purpose of the heat treatment is to facilitate subsequent plastic working of the first and second titanium metal sheets 11, 12.

Step S3: Stamp the first titanium metal sheet to form a plurality of raised sections thereon.

More specifically, the first titanium metal sheet 11 is subjected to stamping, which is a type of mechanical processing, so that a plurality of raised sections 113 is formed on a first surface 111 of the first titanium metal sheet 11. The raised sections 113 provide an effect of condensing the working fluid and can serve as a supporting structure.

Step S4: Bond a metal mesh to one surface of the second titanium metal sheet.

More specifically, a metal mesh 123 is bonded to a third surface 121 of the second titanium metal sheet 12 by means of diffusion bonding. The second titanium metal sheet 12 is used as a heat dissipating sheet in a pure titanium vapor chamber (Ti—VC), and the metal mesh 123 is bonded to the second titanium metal sheet 12 at a diffusion bonding temperature of 650° C.~850° C. The diffusion bonding must be conducted in a process atmosphere of positive-pressure highly pure argon gas (Ar) or in a high vacuum environment of $10^{-4}$~$10^{-6}$ torr at a process pressure of 1 kg~5 kg for a process time of 30~90 minutes. Pure titanium is a metal with very active chemical properties and has a phase transformation temperature of 883° C. That is, pure titanium is in a β-phase at a temperature higher than 883° C. and in an α-phase at a temperature lower than 883° C. Pure titanium in the β-phase has a body-centered cubic (BCC) crystalline structure, and pure titanium in the α-phase has a hexagonal close packed (HCP) crystalline structure.

Pure titanium in a high-temperature environment can react with many elements and compounds and undergo a material phase change. For example, titanium starts absorbing hydrogen in the air at 250° C.; starts absorbing oxygen in the air at 500° C.; and starts absorbing nitrogen in the air at 600° C. The ability of titanium to absorb gases is increased with the rising of temperature. Hydrogen (H), oxygen (O), carbon (C) and Nitrogen (N) can react with titanium to form interstitial slid solutions to cause changes or even defects in the mechanical properties of titanium material and form related compounds, such as $TiO_2$, TiC, TiN and $TiH_2$, which would have an adverse influence on the material's properties, such as rendering the material to be hard but brittle. Therefore, process temperature and process atmosphere (i.e. process environment control) are very important in related thermal processes when manufacturing a titanium heat spreader.

For a conventional copper vapor chamber (Cu—VC), a metal mesh can be bonded thereto at a diffusion bonding temperature of 750° C.~950° C. in a process atmosphere of 15% $H_2$+85% $N_2$ at a process pressure of 1 kg~5 kg for a process time of 40~60 minutes, and no phase change behavior will occur during the high-temperature process. However, copper crystalline grains tend to grow and become coarse when being heated, which would cause largely worsened mechanical properties of the copper material.

Step S5: Close a surface of the first titanium metal sheet having the raised sections onto the surface of the second titanium metal sheet having the metal mesh bonded thereto, and carry out subsequent operations, including seam welding, working fluid filling, vacuumizing and sealing.

More specifically, after completion of the above steps S1 to S4, the processed first and the second titanium metal sheet 11, 12 are subjected to the operations of seam welding, working fluid filling, vacuumizing and sealing. First, close the first surface 111, which has the raised sections 113 formed thereon, of the first titanium metal sheet 11 onto to the third surface 121, which has the metal mesh 123 bonded thereto, of the second titanium metal sheet 12. Then, seams between the first and the second titanium metal sheet 11, 12 are sealed by means of laser beam welding technique. Finally, the operations of working fluid filling, vacuumizing and sealing are sequentially performed.

In the seam welding process using laser beam welding technique, a solid-state thin-disk Yb:YAG laser material is pumped to produce a laser beam having a wavelength of 1030 nm and a laser power of 100~500 W, depending on a thickness of the material. Further, a protective gas, such as helium or argon, must be supplied into the working environment with a helium leak rate smaller than $1.0 \times 10^{-8}$ mbar-L/sec. Or, the laser beam welding should be performed in a vacuum environment of $10^{-2}$ torr.

Laser beam welding has the advantages of concentrated heat energy source that allows for welding in a narrow area without affecting nearby materials; short working time that won't easily change the mechanical properties of the whole workpiece; ultra-clean welding that does not require any solder; and allowing for easy realization of efficient automated production.

Figure 11:
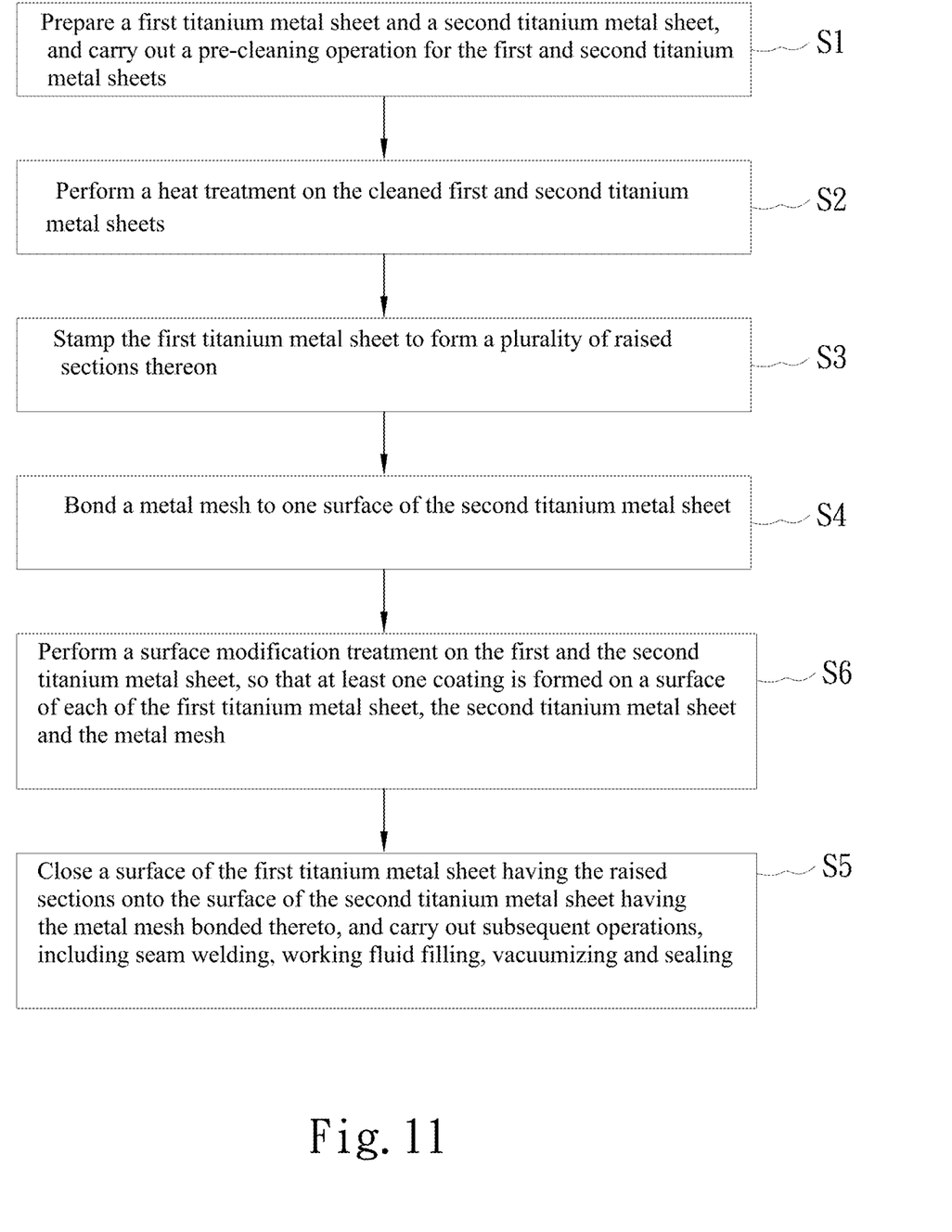
FIG. 11 is a flowchart showing the steps included in a second embodiment of the method of manufacturing the heat dissipation device of the present invention.

Please refer to FIG. 11, which is a flowchart showing the steps included in a second embodiment of the method of manufacturing the heat dissipation device of the present invention. Please refer to FIG. 11 along with FIGS. 1 through 9. As shown, according to the second embodiment thereof, the method of manufacturing the heat dissipation device of the present invention includes the following steps:

Step S1: Prepare a first titanium metal sheet and a second titanium metal sheet, and carry out a pre-cleaning operation for the first and second titanium metal sheets;

Step S2: Perform a heat treatment on the cleaned first and second titanium metal sheets;

Step S3: Stamp the first titanium metal sheet to form a plurality of raised sections thereon;

Step S4: Bond a metal mesh to one surface of the second titanium metal sheet;

Step S6: Perform a surface modification treatment on the first and the second titanium metal sheet, so that at least one coating is formed on a surface of each of the first titanium metal sheet, the second titanium metal sheet and the metal mesh; and Step S5: Close a surface of the first titanium metal sheet having the raised sections onto the surface of the second titanium metal sheet having the metal mesh bonded thereto, and carry out subsequent operations, including seam welding, working fluid filling, vacuumizing and sealing.

The second embodiment of the heat dissipation device manufacturing method is different from the first embodiment in further including a Step S6 after the Step S4.

More specifically, in the Step S6, the surface modification treatment can be performed on the first and the second titanium metal sheet 11, 12 in one of four manners, which are described in details below.

In the first manner of surface modification treatment, the first and the second titanium metal sheet 11, 12 are positioned in an atmosphere furnace (not shown in the drawings); the atmosphere furnace is filled with a process atmosphere of positive-pressure pure argon (Ar) and heated to 400° C.~700° C. for 30~90 minutes, so that a reduction reaction due to overheating occurs on the surfaces of the first and the second titanium metal sheet 11, 12. In this process, a trace amount of oxygen in the process atmosphere is controlled to form very fine anatase $TiO_2$ nanorods on the surface of the titanium material. Anatase $TiO_2$ nanorods are highly hydrophilic structures and can maintain the hydrophilic property for a relatively long time about 1 to 2 weeks. However, the hydrophilic property gradually weakens with time and influences from surrounding environments, such as moisture. In this case, the product can be irradiated with ultraviolet (UV) light to regain the hydrophilic property due to a photocatalytic effect of $TiO_2$ material. The length of UV irradiation time is about 20 to 60 minutes, depending on the intensity of UV light.

In the second manner of surface modification treatment, the first and the second titanium metal sheet 11, 12 are positioned in an atmosphere furnace; the atmosphere furnace is then vacuumized and heated to 400° C.~700° C. for 30~90 minutes, so that a reduction reaction due to overheating occurs on the surfaces of the first and the second titanium metal sheet 11, 12. In this process, a trace amount of oxygen in the process atmosphere is controlled to form very fine anatase $TiO_2$ nanorods on the surface of the titanium material. Anatase $TiO_2$ nanorods are highly hydrophilic structures and can maintain the hydrophilic property for a relatively long time about 1 to 2 weeks. However, the hydrophilic property gradually weakens with time and influences from surrounding environments, such as moisture. In this case, the product can be irradiated with ultraviolet (UV) light to regain the hydrophilic property due to a photocatalytic effect of $TiO_2$ material. The length of UV irradiation time is about 20 to 60 minutes, depending on the intensity of UV light.

In the third manner of surface modification treatment, a sol-gel coating process is performed mainly on the metal mesh 123 bonded to the surface of the second titanium metal sheet 12. First, a layer of crystalline $SiO_2$ is coated on the metal mesh 123 to service as a base layer. The $SiO_2$-coated metal mesh 123 is then dried in an oven at 80° C. and subsequently coated with a layer of anatase $TiO_2$. Thereafter, the thermal-treated coating is subjected to a densification sintering treatment to form a composite film of $SiO_2/TiO_2$ on the metal mesh 123. The densification sintering treatment is carried out at a temperature of 400° C.~700° C. for 30~90 minutes in a process atmosphere of positive-pressure pure argon (Ar). The composite film of $SiO_2/TiO_2$ so formed is a highly hydrophilic structure and can maintain the hydrophilic property for a relatively long time about 1 to 2 weeks. However, the hydrophilic property gradually weakens with time and influences from surrounding environments, such as moisture. In this case, the product can be irradiated with ultraviolet (UV) light to regain the hydrophilic property due to a photocatalytic effect on the surface of the composite film of $SiO_2/TiO_2$. The length of UV irradiation time is about 20 to 60 minutes, depending on the intensity of UV light.

In the fourth manner of surface modification treatment, a sol-gel coating process is performed mainly on the metal mesh 123 bonded to the surface of the second titanium metal sheet 12. First, a layer of crystalline $SiO_2$ is coated on the metal mesh 123 to service as a base layer. The $SiO_2$-coated metal mesh 123 is then dried in an oven at 80° C. and subsequently coated with a layer of anatase $TiO_2$. Thereafter, the thermal-treated coating is subjected to a densification sintering treatment to form a composite film of $SiO_2/TiO_2$ on the metal mesh 123. The densification sintering treatment is carried out at a temperature of 400° C.~700° C. for 30~90 minutes in a vacuumized process environment. The composite film of $SiO_2/TiO_2$ so formed is a highly hydrophilic structure and can maintain the hydrophilic property for a relatively long time about 1 to 2 weeks. However, the hydrophilic property gradually weakens with time and influences from surrounding environments, such as moisture. In this case, the product can be irradiated with ultraviolet (UV) light to regain the hydrophilic property due to a photocatalytic effect on the surface of the composite film of $SiO_2/TiO_2$. The length of UV irradiation time is about 20 to 60 minutes, depending on the intensity of UV light.

In summary, according to the present invention, commercially pure titanium material is utilized as a substrate material to replace the conventional copper material for manufacturing a heat dissipation device, such as a vapor chamber. The present invention also provides a process for working pure titanium. With the present invention, it is possible to replace copper with pure titanium in the manufacturing of heat dissipation devices so as to overcome some disadvantages of copper. Pure titanium not only can replace copper, aluminum and stainless steel to serve as the material for manufacturing heat dissipation units but also has the advantages of light weight, high structural strength and high corrosion resistance, and is therefore very suitable for making a load-bearing base or a load-bearing bezel of a handheld device or a mobile device. In this case, the load-bearing structure and the heat dissipation device of the handheld or mobile device can be integrally manufactured to meet the present demands for low-profile or slim-type mobile devices or handheld devices and to achieve the effects of bearing load and dissipating heat at the same time.

In the above embodiments, the metal mesh can be made of titanium, stainless steel, copper, aluminum or any other suitable metal material. Alternatively, the metal mesh can include two metal meshes, such as a titanium mesh and a stainless steel mesh, which are superposed and located between the first and the second titanium metal sheet.

Pure titanium material in the form of a thin sheet is a shape-memory metal. That is, when the pure titanium material is bent and deformed by an external force applied thereto, the deformed titanium material will return to its pre-deformed shape when the external force is removed. Therefore, thin-sheet pure titanium material can also be directly used with smart watches or be used to manufacture watchbands to provide the smart watches with heat-dissipating and supporting effects at the same time.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation device comprising:
 a first titanium metal sheet having a first surface and an opposite second surface, and the first surface having a plurality of raised sections formed thereon;
 a second titanium metal sheet having a third surface and an opposite fourth surface; and
 a metal mesh bonded to the third surface and the first titanium metal sheet and the second titanium metal sheet being correspondingly closed to each other to together define a sealed chamber, in which a working fluid is filled,
 wherein the metal mesh includes a first metal mesh and a second metal mesh;

the first metal mesh being a titanium mesh; and the second metal mesh being a stainless steel mesh; and the first and the second metal mesh being superposed on each other.

2. The heat dissipation device as claimed in claim 1, wherein the raised sections are formed by stamping the first surface of the first titanium metal sheet.

3. The heat dissipation device as claimed in claim 1, further comprising a first coating formed on surfaces of the raised sections, a second coating formed on the third surface of the second titanium metal sheet and located between the third surface and the metal mesh, and a third coating formed on a surface of the metal mesh opposite to the second coating; and the first, the second and the third coating being respectively selected from the group consisting of a hydrophilic coating and a hydrophobic coating.

4. The heat dissipation device as claimed in claim 3, wherein the hydrophilic coating is selected from the group consisting of a titanium dioxide coating and a silicon dioxide coating.

5. The heat dissipation device as claimed in claim 1, wherein the second surface of the first titanium metal sheet serves as a condensing side of the heat dissipation device, and the fourth surface of the second titanium metal sheet serves as a heat-absorbing side of the heat dissipation device.

* * * * *